United States Patent
Chowdhury et al.

(10) Patent No.: US 10,400,327 B2
(45) Date of Patent: Sep. 3, 2019

(54) COUNTER BASED TIME COMPENSATION TO REDUCE PROCESS SHIFTING IN REACTIVE MAGNETRON SPUTTERING REACTOR

(71) Applicant: APPLIED MATERIALS, INC., Santa Clara, CA (US)

(72) Inventors: Mohammad Kamruzzaman Chowdhury, Malta, NY (US); Zhenbin Ge, San Jose, CA (US); Adolph Miller Allen, Oakland, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 525 days.

(21) Appl. No.: 15/007,181

(22) Filed: Jan. 26, 2016

(65) Prior Publication Data
US 2016/0222503 A1    Aug. 4, 2016

Related U.S. Application Data

(60) Provisional application No. 62/110,483, filed on Jan. 31, 2015.

(51) Int. Cl.
*C23C 14/34* (2006.01)
*C23C 14/35* (2006.01)
(Continued)

(52) U.S. Cl.
CPC ...... *C23C 14/3492* (2013.01); *C23C 14/3414* (2013.01); *C23C 14/35* (2013.01);
(Continued)

(58) Field of Classification Search
CPC .............................. C23C 14/542; C23C 14/52
See application file for complete search history.

(56) References Cited

U.S. PATENT DOCUMENTS

| 5,455,197 A | 10/1995 | Ghanbari et al. |
| 5,643,422 A | 7/1997 | Yamada |
| (Continued) | | |

FOREIGN PATENT DOCUMENTS

| WO | WO 02/18653 A2 | 3/2002 |

OTHER PUBLICATIONS

International Search Report and Written Opinion dated Jul. 1, 2016 for PCT Application No. PCT/US2016/015375.

*Primary Examiner* — Jason Berman
(74) *Attorney, Agent, or Firm* — Moser Taboada; Alan Taboada

(57) ABSTRACT

A method of processing a substrate includes: sputtering target material for a first amount of time using a first plasma formed from an inert gas and a first amount of power; determining a first counter, based on a product of a flow rate of the inert gas, the first amount of power, and the first amount of time; sputtering a metal compound material for a second amount of time using a second plasma formed from a process gas comprising a reactive gas and an inert gas and a second amount of power; determining a second counter based on a product of a flow rate of the process gas, the second amount of power, and the second amount of time; determining a third counter; and depositing a metal compound layer onto a predetermined number of substrates, wherein a deposition time for each substrate is adjusted based on the third counter.

20 Claims, 5 Drawing Sheets

(51) Int. Cl.
*C23C 14/54* (2006.01)
*H01J 37/34* (2006.01)
*C23C 14/52* (2006.01)

(52) U.S. Cl.
CPC ............ *C23C 14/52* (2013.01); *C23C 14/542* (2013.01); *H01J 37/3405* (2013.01); *H01J 37/347* (2013.01); *H01J 37/3426* (2013.01); *H01J 37/3444* (2013.01); *H01J 37/3464* (2013.01); *H01J 37/3473* (2013.01)

(56) References Cited

U.S. PATENT DOCUMENTS

| | | | | |
|---|---|---|---|---|
| 5,911,856 | A * | 6/1999 | Suzuki | C23C 14/0042 204/192.13 |
| 6,132,563 | A | 10/2000 | Frach et al. | |
| 2005/0205413 | A1* | 9/2005 | Ikari | C23C 14/0036 204/192.13 |
| 2007/0181421 | A1 | 8/2007 | Wei et al. | |
| 2013/0167773 | A1* | 7/2013 | Yang | C23C 14/044 118/720 |

* cited by examiner

COUNTER BASED TIME COMPENSATION TO REDUCE PROCESS SHIFTING IN REACTIVE MAGNETRON SPUTTERING REACTOR

CROSS-REFERENCE TO RELATED APPLICATIONS

This application claims benefit of U.S. provisional patent application Ser. No. 62/110,483, filed Jan. 31, 2015, which is herein incorporated by reference in its entirety.

FIELD

Embodiments of the present disclosure generally relate to substrate processing systems.

BACKGROUND

Reactive magnetron sputtering is the sputtering of an elemental target containing one or more elements in the presence of a gas that will react with the target materials to form a compound inside the reactor. One example of reactive magnetron sputtering is adding nitrogen to the reactor while sputtering titanium to form titanium nitride (TiN). Reactive magnetron sputtering for thin film processes has been used in numerous industrial applications. For example, in semiconductor processing, titanium nitride (TiN) has been used as a hardmask for copper dual damascene applications.

The reaction mechanism between the sputtered materials and the reactive gas create unique and complex processing stability problems for reactive magnetron sputtering processes. For example, during target sputtering processes, the reactive gas will react with the target surface, chamber kit surface, and at the substrate to form compounds of the deposited film.

One of the biggest challenges in reactive magnetron titanium nitride (TiN) sputtering is defect control. A periodic pure titanium (Ti) sputtering is often implemented to mitigate the brittleness of the titanium nitride (TiN) films on the process kit as well as to mitigate titanium nitride (TiN) formation on the target surface. Due to the periodic pure titanium (Ti) sputtering, the target surface and process kit surface can become significantly altered after titanium (Ti) sputtering, which will cause a noticeable shifting in process parameters and film properties.

Accordingly, the inventors have provided improved methods and apparatus for processing a substrate.

SUMMARY

Embodiments of the present disclosure include methods and apparatus for processing a substrate. In some embodiments, a method of processing a substrate includes: (a) sputtering target material from a metal target for a first amount of time using a first plasma formed from an inert gas and a first amount of power applied to the metal target; (b) determining a first counter, wherein the first counter is a product of a flow rate of the inert gas provided to sputter target material from the metal target, the first amount of power applied to ignite the first plasma to sputter target material from the metal target, and the first amount of time for which the metal target is sputtered; (c) sputtering a metal compound material from the metal target for a second amount of time using a second plasma formed from a process gas comprising a reactive gas and an inert gas and a second amount of power applied to the metal target; (d) determining a second counter, wherein the second counter is a product of a flow rate of the process gas provided to sputter the metal compound material from the metal target, the second amount of power applied to ignite the second plasma to sputter the metal compound material from the metal target, and the second amount of time for which the metal compound material is sputtered; (e) determining a third counter, wherein the third counter is the first counter minus the second counter; and (f) depositing a metal compound layer onto a predetermined number of substrates, wherein a deposition time for each substrate is adjusted based on the third counter to deposit the metal compound layer.

In some embodiments, a method of processing a substrate includes: (a) sputtering titanium material from a titanium target for a first amount of time using a first plasma formed from an inert gas and a first amount of power applied to the titanium target; (b) determining a first counter, wherein the first counter is a product of a flow rate of the inert gas provided to sputter titanium material from the titanium target, the first amount of power applied to ignite the first plasma to sputter the titanium material from the titanium target, and the first amount of time for which the titanium target is sputtered; (c) sputtering titanium nitride from the titanium target for a second amount of time using a second plasma formed from a process gas comprising an inert gas and a nitrogen-containing gas and a second amount of power applied to the titanium target; (d) determining a second counter, wherein the second counter is a product of a flow rate of the process gas provided to sputter titanium nitride from the titanium target, the second amount of power applied to ignite the second plasma to sputter titanium nitride from the titanium target, and the second amount of time for which the titanium nitride is sputtered; (e) determining a third counter, wherein the third counter is the first counter minus the second counter; and (f) depositing a titanium nitride layer onto a predetermined number of substrates, wherein a deposition time for each substrate is adjusted based on the third counter to deposit the titanium nitride layer.

In some embodiments, a computer readable medium is provided having instructions stored thereon that, when executed, cause a method to be performed for processing a substrate. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
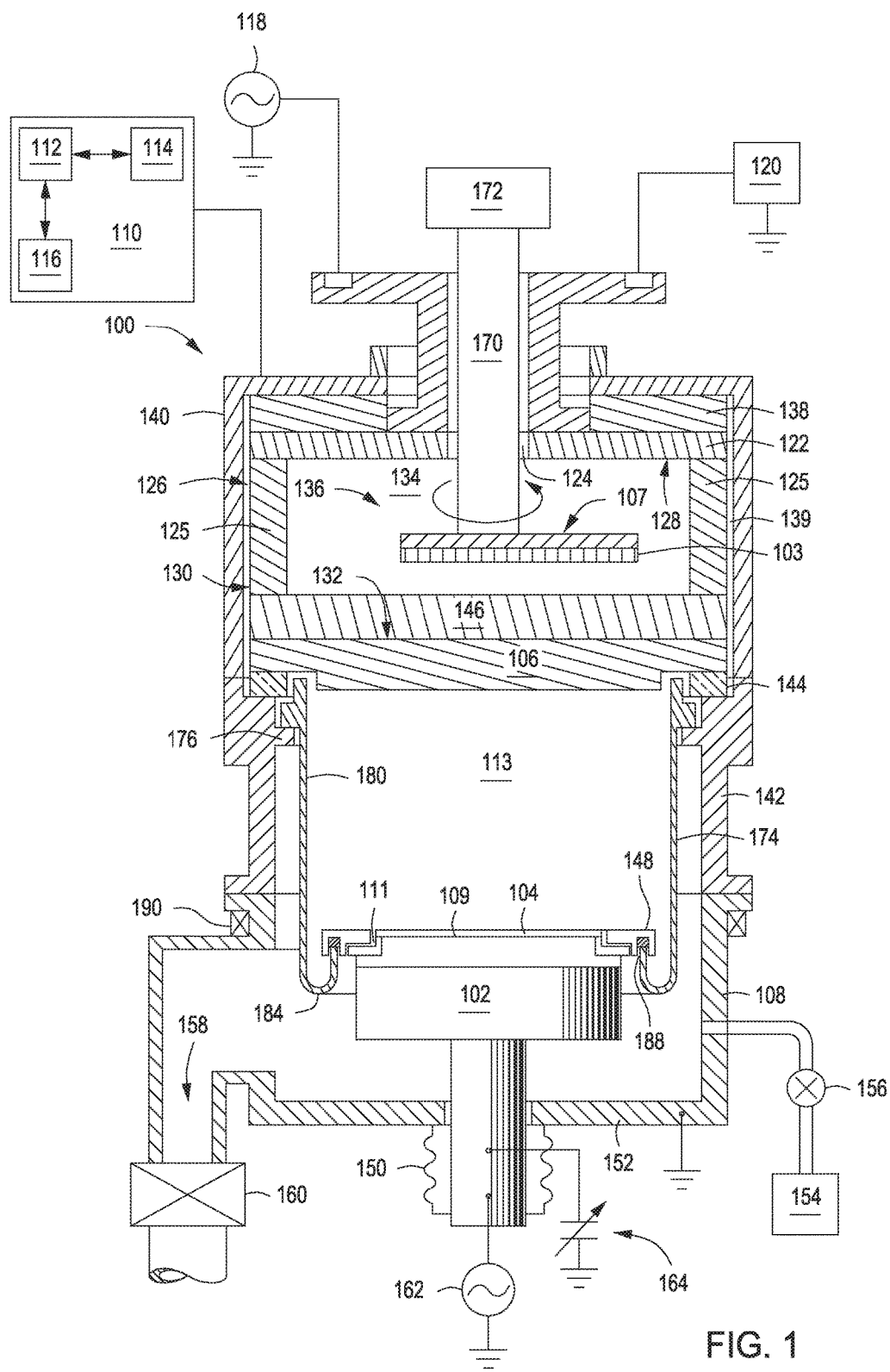
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure include methods and apparatus for processing a substrate. In embodiments of the current disclosure, a drifting variation in one or more of deposited film thickness, sheet resistivity (Rs), or resistivity across multiple substrate runs in a reactive magnetron sputtering process, can advantageously be reduced, eliminated, or substantially eliminated. Embodiments of the current disclosure may be applied to any type of reactive magnetron sputtering, for example, use to deposit titanium nitride (TiN), aluminum oxide ($Al_2O_3$), aluminum nitride (AlN), or the like.

The inventors have observed that one of the biggest challenges in reactive magnetron sputtering is defect control. For example, in the reactive magnetron sputtering of a titanium nitride (TiN) film using a titanium target, a periodic pure titanium (Ti) sputtering can be used to mitigate the brittleness of the titanium nitride (TiN) films on the process kit as well as mitigate titanium nitride (TiN) formation on the target surface. However, due to the periodic pure titanium (Ti) sputtering, the target surface and process kit surface can become significantly altered after a pure titanium (Ti) sputtering process, which will cause a noticeable shifting in process parameters and film properties (i.e., "film property shift"). As used herein, the term "pure" means that the sputterable material of the target is completely, or substantially completely, composed of metal, with an allowance for some impurities. For example, in some embodiments, the target may comprise about 99 to about 99.99% of the metal to be sputtered.

The inventors have observed that the film property shift issue can be mitigated by adding a sacrificial titanium nitride (TiN) deposition process (i.e., a conditioning process) after pure titanium (Ti) sputtering but before actual titanium nitride (TiN) wafer processing. However, within the limit of acceptable sacrificial titanium nitride (TiN) deposition time, there is still a consistent thickness trend shown in subsequent titanium nitride (TiN) wafer processing. Various nitrogen ($N_2$) gas flow and temperature control methods have been tested for pure titanium (Ti) sputtering with titanium nitride (TiN) conditioning process (i.e., a paste process), but the trends persist for a titanium (Ti) paste process. The method 200 described below advantageously reduces, eliminates, or substantially eliminates drifting variation in one or more of deposited film thickness, sheet resistivity (Rs), or resistivity across multiple substrate runs in a reactive magnetron sputtering process.

Figure 2:
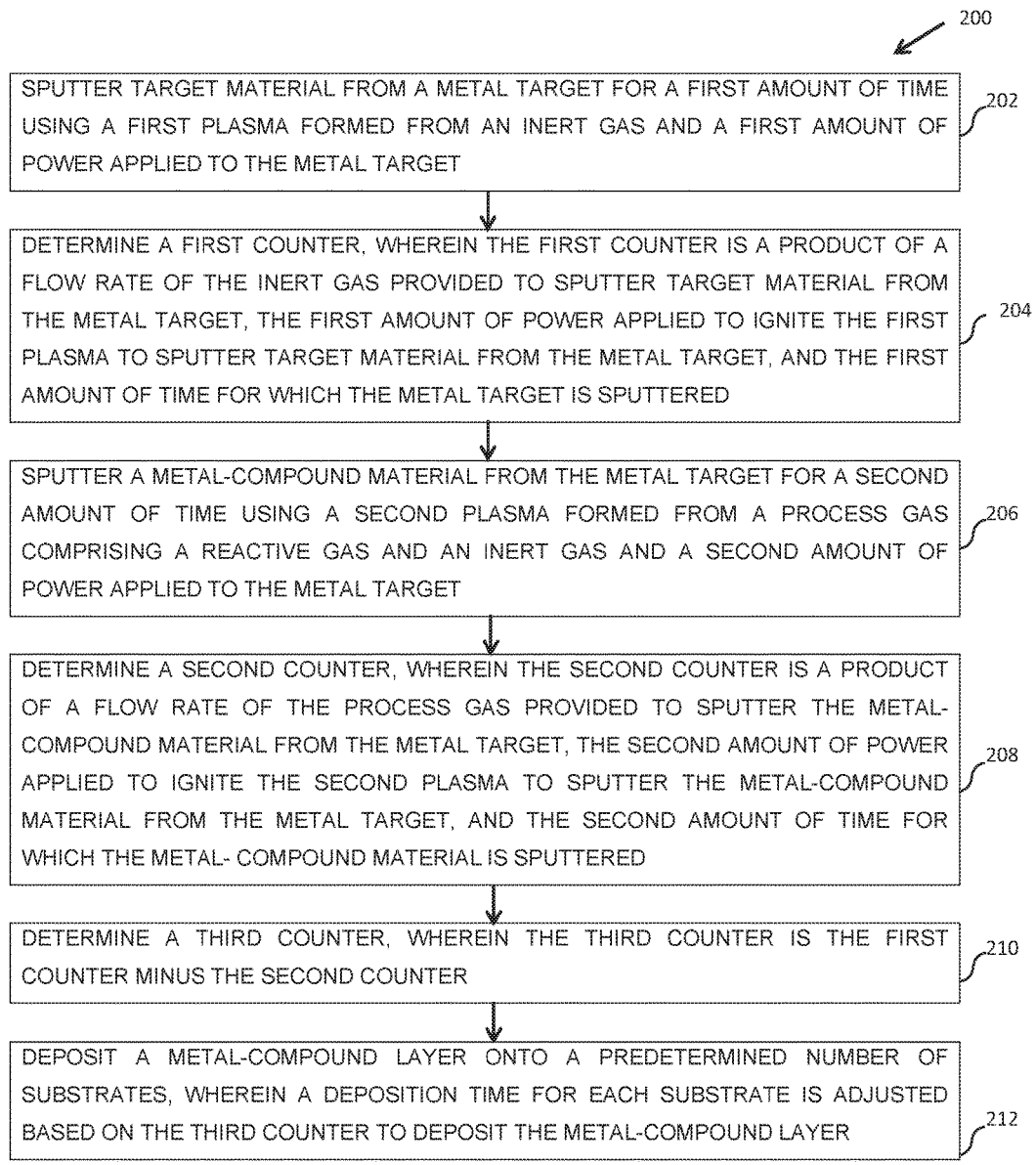
FIG. 2 depicts a method of processing a substrate in accordance with some embodiments of the present disclosure.

FIG. 1 depicts a schematic cross sectional view of a process chamber suitable for performing methods in accordance with some embodiments of the present disclosure. FIG. 2 depicts the method 200 of processing a substrate in accordance with some embodiments of the present disclosure. The method 200 may be implemented by a suitable controller, such as controller 110 described below with respect to FIG. 1.

The method 200 generally begins by performing a paste process including a pure metal sputter (as described at 202) and a metal conditioning process (as described at 206). At 202, target material from a metal target is sputtered and deposited on the interior surfaces of the processing volume of a suitable physical vapor deposition chamber (such as depicted in FIG. 1) for a first amount of time using a first plasma formed from an inert gas and a first amount of power applied to the metal target. The sputter deposition at 202 is performed in the process chamber, for example described in FIG. 1, without a substrate in the process chamber and deposits a metal layer atop the interior surfaces of the processing volume of the physical vapor deposition chamber. The metal layer consists of, or consists essentially of, the target material of the metal target. The sputter deposition process at 202 is a pure metal sputtering process, as described above, and can be used to mitigate brittleness of the metal-containing films on the process kit as well as mitigate the formation of undesirable metal-containing films on the target surface.

Next, at 204, a first counter is determined based on the product of: [a flow rate of the inert gas provided to sputter target material from the metal target], [the first amount of power applied to ignite the first plasma to sputter target material from the metal target], and [the first amount of time for which the metal target is sputtered].

The metal target is composed of any metal target material suitable for semiconductor processes, such as titanium, tantalum, tungsten, aluminum, or the like. The metal target is a pure metal target. As used herein, the term "pure metal" means that the sputterable material of the target is completely, or substantially completely, composed of metal, with an allowance for some impurities. For example, in some embodiments, the target may comprise about 99 to about 99.99% of the metal to be sputtered. In some embodiments, the inert gas is any suitable inert gas to sputter target material in a physical vapor deposition chamber, for example, one or more of argon, xenon, krypton, or the like. In some embodiments, the flow rate of the inert gas is any suitable flow rate to sputter a target material in a physical vapor deposition chamber, for example a flow rate of about 5 to about 1000 sccm. In some embodiments, the first amount of power is any suitable amount of power used to sputter target material in a physical vapor deposition chamber. For example, in some embodiments, RF power of about 50 to about 10,000 watts is provided to the metal target to form a first plasma suitable for sputtering a target material. In some embodiments, the first amount of time is any suitable amount of time to mitigate the brittleness of the metal films on the process kit as well as metal formation on the metal target surface. For example, the first amount of time can be about 1 to about 100 seconds.

Next, at 206, metal compound material from the metal target is sputtered for a second amount of time using a second plasma formed from a process gas comprising a reactive gas and an inert gas and a second amount of power applied to the metal target. The sputter deposition at 206 is performed in the process chamber, for example described in FIG. 1, without a substrate in the process chamber and deposits a metal compound layer atop the material deposited on interior surfaces of the processing volume of the physical vapor deposition chamber. The metal compound layer comprises the metal material from the target as well as one or more elements from the reactive gas. The sputter deposition at 206 is a metal conditioning process used to mitigate any film property shift, as described above, that may be caused by the pure metal sputtering performed at 202. The combination of 202 and 206 result in a paste process.

Next, at 208, a second counter is determined based on the product of: [a flow rate of the process gas provided to sputter the metal compound material from the metal target], [the second amount of power applied to ignite the second plasma to sputter the metal compound material from the metal target], and [a second amount of time for which the metal compound material is sputtered].

In some embodiments, the reactant gas is a nitrogen-containing gas, such as nitrogen ($N_2$), or an oxygen-containing gas, such as oxygen ($O_2$). In some embodiments, the inert gas is one or more of argon, xenon, krypton, or the like. The flow rate of the reactant gas is any suitable flow rate to deposit a metal compound layer in physical vapor deposition chamber. In some embodiments, the flow rate of the process gas is any suitable flow rate to sputter the metal compound material in a physical vapor deposition chamber, for example a flow rate of about 5 to about 1000 sccm. In some embodiments, the metal compound material can be titanium nitride (TiN), tantalum nitride (TaN), tungsten nitride (WN) aluminum nitride (AlN), aluminum oxide ($Al_2O_3$), or the like. In some embodiments as described above, the second amount of power is any suitable amount of power used to sputter the metal compound material in a physical vapor deposition chamber. For example, in some embodiments, RF power of about 50 to about 10,000 watts is provided to the metal target to form a plasma suitable for sputtering the metal compound material. In some embodiments, the second amount of time is any suitable amount of time to mitigate any film property shift that may result from the pure metal sputtering at 202. For example, the second amount of time can be about 0.1% to 100% of the first amount of time. In some embodiments, the second amount of time can be about 1 to about 100 seconds.

Next, at 210 a third counter is determined, wherein the third counter is equal to the first counter minus the second counter. Next, at 212, a metal compound layer is deposited onto a predetermined number of substrates, for example about 25 substrates (although greater or fewer numbers of substrates may be processed). The deposition time for each substrate is adjusted based on the third counter to deposit the metal compound layer having a substantially constant predetermined thickness onto each substrate. For example, the deposition time ($T_{dn}$) for each subsequent substrate may be increased by the third counter (C) to account for changes in a desired film parameter, such as film thickness, sheet resistivity, resistivity, or the like. For example, in a substrate run, the deposition time for each substrate can be calculated by $(T_{dn})=T_{d1}+C(n)$ wherein n is the number of the substrate being processed starting with the second substrate and $T_{d1}$ is a known deposition time for the first substrate. The inventors have discovered that a deposition time ($T_{dn}$) for each subsequent substrate after the first substrate based on the third counter (C) can be calculated in the software of a suitable process chamber (for example in the controller of the physical vapor deposition chamber described below) to adjust the deposition time on each substrate so as to reduce, eliminate, or substantially eliminate drifting variation in one or more of deposited film thickness, sheet resistivity (Rs), or resistivity across multiple substrate runs in a reactive magnetron sputtering process. The metal compound layer at 212 is deposited atop each substrate using a suitable physical vapor deposition process.

After a suitable number of substrates have been processed, for example, after a given lot of substrates have been processed, or when deposition results meet or fail to meet a given criteria, the method generally ends. The method 200 may be repeated. For example, prior to each paste process described at 202 and 206 above, the first and second counters calculated at 204 and 208 can be reset to zero and the method 200 can be repeated to deposit a metal compound layer having a substantially constant predetermined thickness onto a predetermined number of substrates. Thus, the paste and deposition processes may be repeated indefinitely, for example, until the target is consumed and needs to be replaced. After replacement of a new target, the method 200 may again be repeated as desired.

Figure 3:
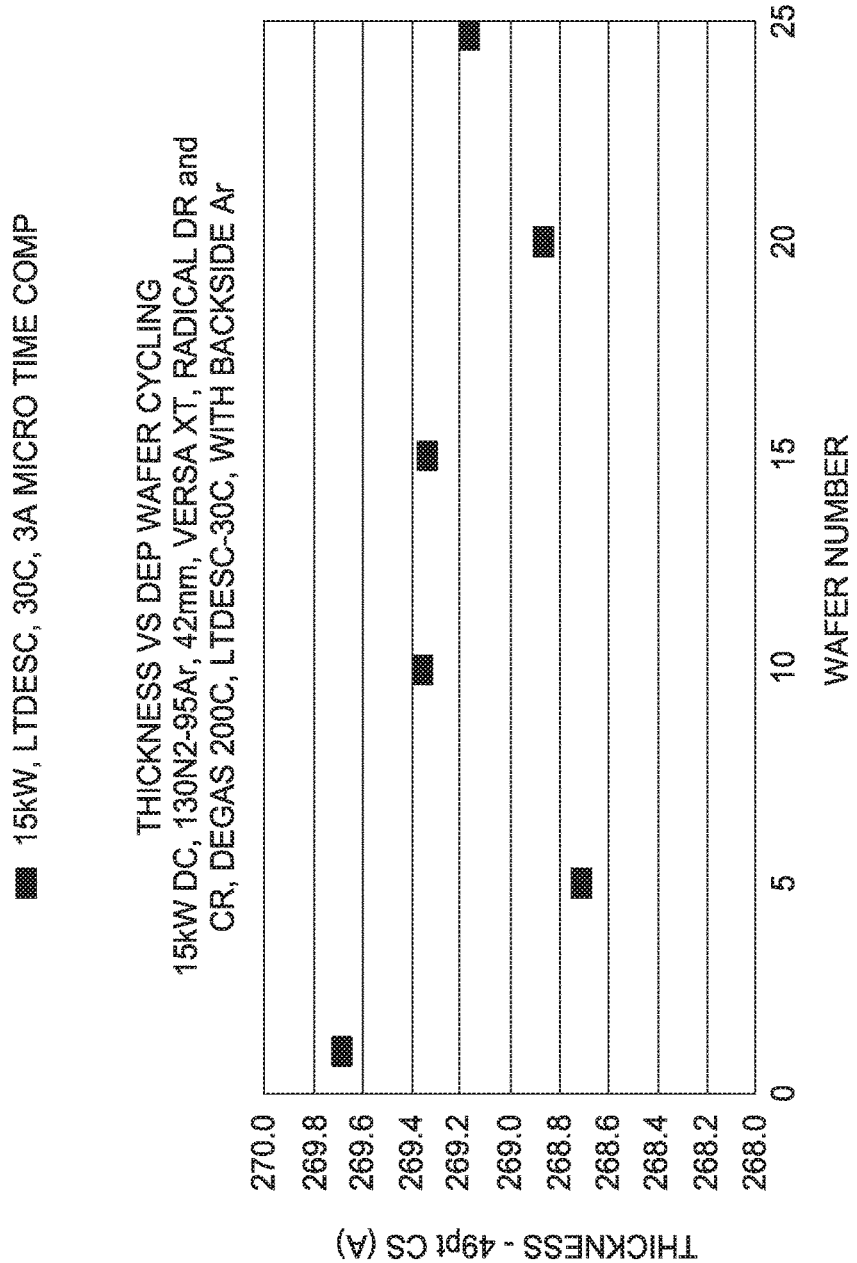
FIG. 3 depicts a graph of thickness versus substrate cycling after the method of processing a substrate in accordance with some embodiments of the present disclosure.
Figure 4:
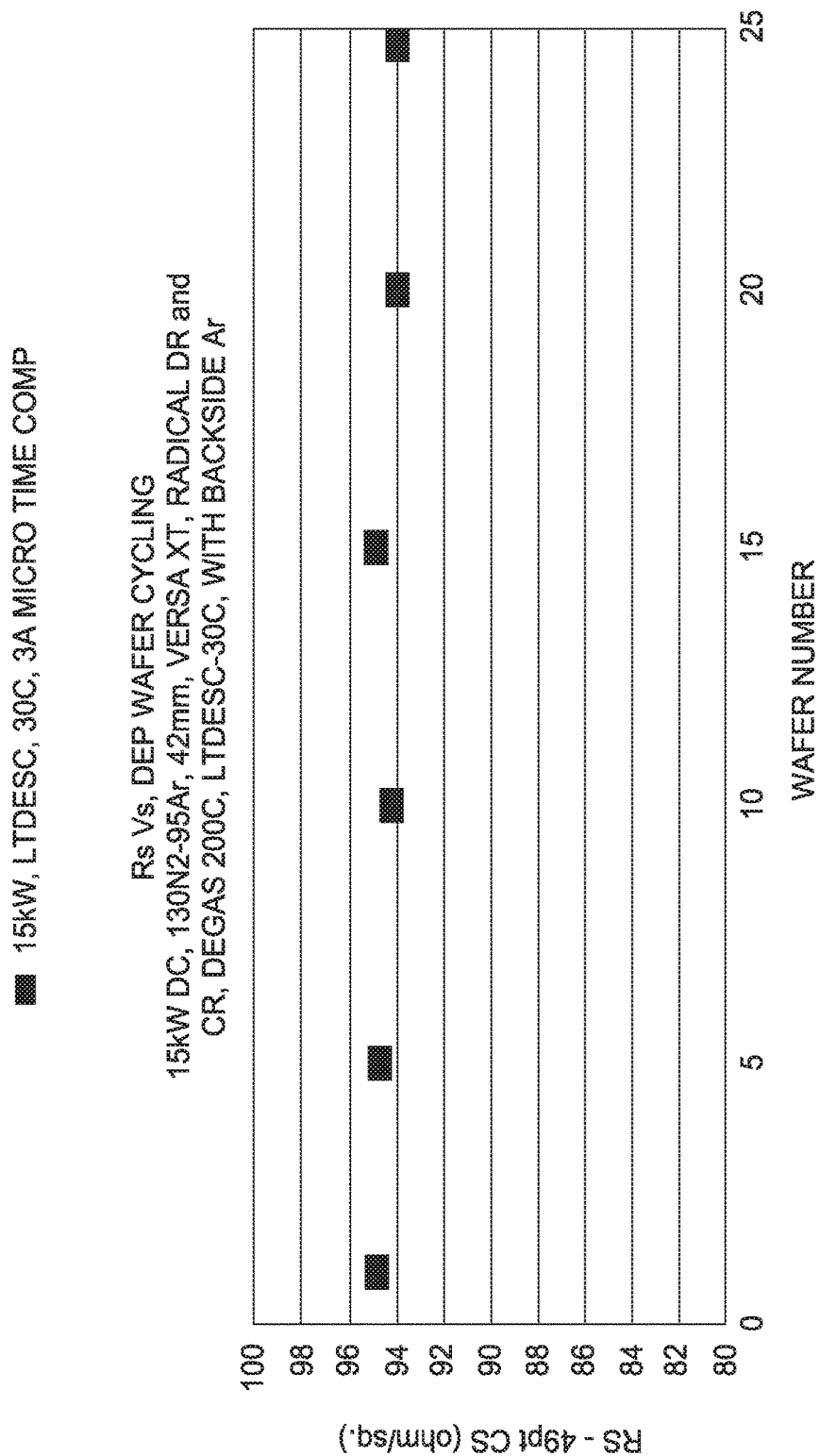
FIG. 4 depicts a graph of Rs versus substrate cycling after the method of processing a substrate in accordance with some embodiments of the present disclosure.
Figure 5:
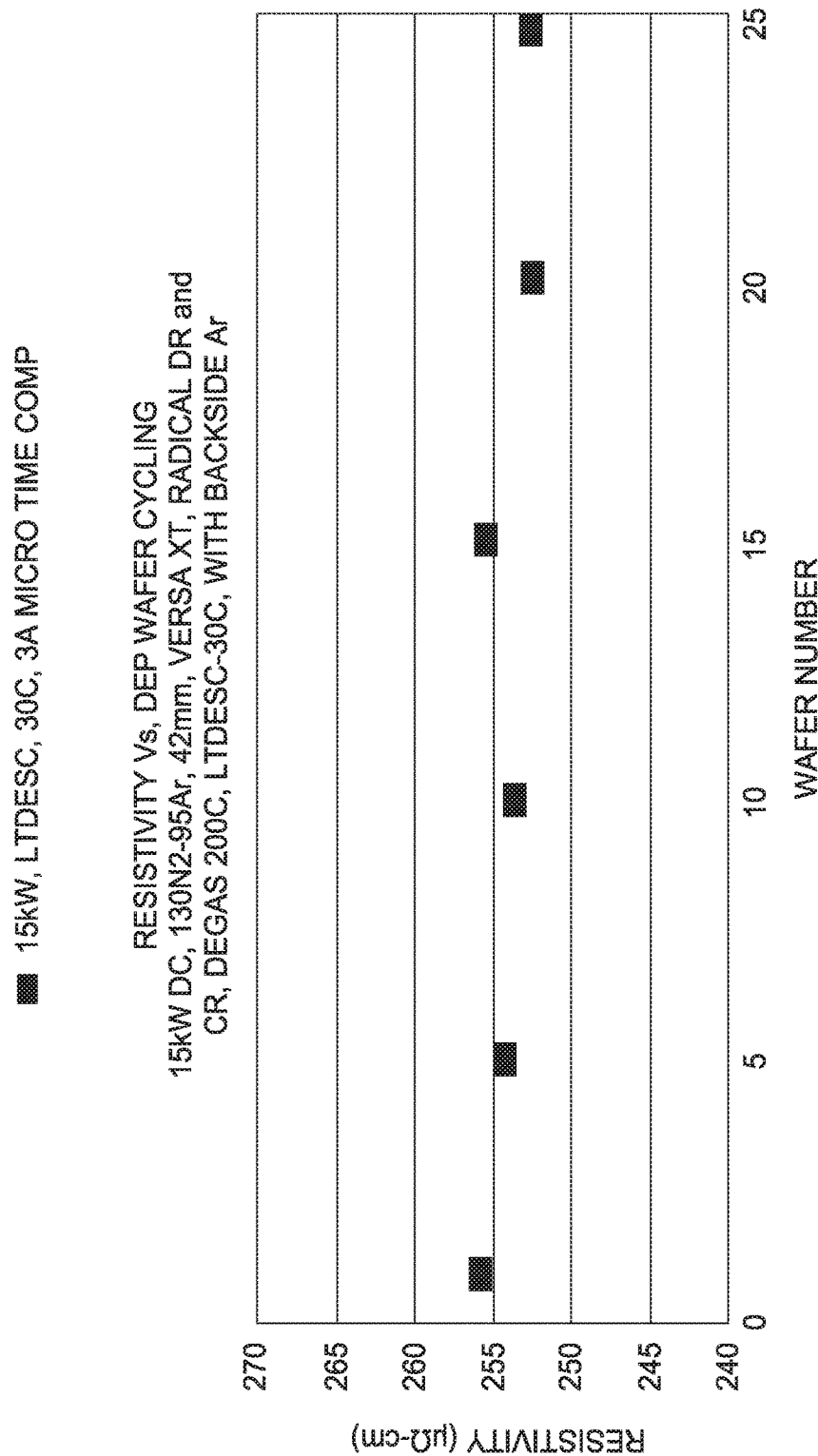
FIG. 5 depicts a graph of resistivity versus substrate cycling after the method of processing a substrate in accordance with some embodiments of the present disclosure.

As shown in FIG. 3, after implementing method 200 after a titanium (Ti) paste run, the drifting variation from the 1st substrate to the 25th substrate has been advantageously reduced to about 0.5 angstroms and the range variation within the 25th substrate has been reduced to less than about 1 angstrom. As shown in FIG. 4 and FIG. 5, respectively, the method 200 also advantageously reduces the Rs and resistivity drifting to less than about 1% over a 25 substrate run. Other numbers of substrates may also be processed in runs of different sizes, such as less than 25 or greater than 25.

FIG. 1 depicts a simplified, cross-sectional view of a physical vapor deposition (PVD) chamber (chamber 100), suitable for performing the method 200 described below. Examples of PVD chambers suitable for modification in accordance with the teachings provided herein include chambers having very high frequency (VHF) sources, the ALPS® Plus and SIP ENCORE® PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein and be used to perform embodiments of the inventive methods disclosed herein.

The chamber 100 contains a substrate support 102 for receiving a substrate 104 on the substrate support, and a sputtering source, such as a target 106. In some embodiments, the substrate support is configured as an electrostatic chuck The substrate support 102 may be located within a grounded enclosure wall (e.g., chamber wall 108), which may be a chamber wall (as shown) or a grounded shield (a ground shield 140 is shown covering at least some portions of the chamber 100 above the target 106. In some embodiments, the ground shield 140 could be extended below the target to enclose the substrate support 102 as well).

In some embodiments, the process chamber includes a feed structure for coupling RF and DC energy to the target 106. The feed structure is an apparatus for coupling RF and DC energy to the target, or to an assembly containing the target, for example, as described herein. A first end of the feed structure can be coupled to an RF power source 118 and a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 118 and the DC power source 120. In some embodiments, about 6 kW of 40 MHz RF is provided at the same time about 1 kW of DC power is provided. In some embodiments, the RF power is provided at about 4 kW to about 8 Kw at a frequency of about 13.56 MHz to about 60 MHz, and the DC power simultaneously at about 0.5 kW to about 2 kW.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure). The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 122. The source distribution plate includes a hole 124 disposed through the source distribution plate 122 and aligned with a central opening of the feed structure. The source distribution plate 122 may be fabricated from suitable conductive materials to conduct the RF and DC energy from the feed structure.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening of the body via the hole 124 of the source distribution plate 122. The cavity 134 and the central opening of the body may be utilized to at least partially house one or more portions of a rotatable magnetron assembly 136. In some embodiments, the cavity may be at least partially filled with a cooling fluid, such as water ($H_2O$) or the like.

A ground shield 140 may be provided to cover the outside surfaces of the lid of the chamber 100. The ground shield 140 may be coupled to ground, for example, via the ground connection of the chamber body. The ground shield 140 has a central opening to allow the feed structure to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

An isolator plate 138 may be disposed between the source distribution plate 122 and the ground shield 140 to prevent the RF and DC energy from being routed directly to ground. The isolator plate 138 has a central opening to allow the feed structure to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

The target 106 may be supported on a grounded conductive aluminum adapter (adapter 142) through a dielectric isolator 144. The target 106 comprises a material to be deposited on the substrate 104 during sputtering, such a metal or metal oxide. In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support 102 has a material-receiving surface facing the principal surface of the target 106 and supports the substrate 104 to be sputter coated in planar position opposite to the principal surface of the target 106. The substrate support 102 may support the substrate 104 in a first volume 113 of the chamber 100. The first volume 113 is defined as the region above the substrate support 102 during processing (for example, between the target 106 and the substrate support 102 when in a processing position).

In some embodiments, the substrate support 102 may be vertically movable through a bellows 150 connected to a bottom chamber wall 152 to allow the substrate 104 to be transferred onto the substrate support 102 through a load lock valve (not shown) in the lower portion of processing the chamber 100 and subsequently raised to a deposition, or processing position. One or more processing gases may be supplied from a gas source 154 through a mass flow controller 156 into the lower part of the chamber 100. An exhaust port 158 may be provided and coupled to a pump (not shown) via a valve 160 for exhausting the interior of the chamber 100 and facilitating maintaining a pressure inside the chamber 100.

An RF bias power source 162 may be coupled to the substrate support 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. Optionally, a second RF bias power source (not shown) may be coupled to the substrate support 102 and provide any of the frequencies discussed above for use with the RF bias power source 162. In other applications, the substrate support 102 may be grounded or left electrically floating. For example, a capacitance tuner 164 may be coupled to the substrate support for adjusting voltage on the substrate 104 for applications where RF bias power may not be used. In some embodiments, the capacitance tuner 164 may be used to adjust the substrate floating potential so that ion energy arriving at the substrate can be controlled. In some embodiments, the RF bias power source 162 and the capacitance tuner 164 may both be applied simultaneously.

A rotatable magnetron assembly 136 may be positioned proximate a back surface (e.g., source distribution plate-facing surface 132) of the target 106. The rotatable magnetron assembly 136 includes the magnetron 107 which connects to a rotation shaft 170 coincident with the central axis of the chamber 100 and the substrate 104. A motor 172 can be coupled to the upper end of the rotation shaft 170 to drive rotation of the magnetron assembly 136. The magnets 103 produce a magnetic field within the chamber 100, generally parallel and close to the surface of the target 106 to trap electrons and increase the local plasma density, which in turn increases the sputtering rate. The magnets 103 produce an electromagnetic field around the top of the chamber 100, and the magnets are rotated to rotate the electromagnetic field which influences the plasma density of the process to more uniformly sputter the target 106. For example, the rotation shaft 170 may make about 0 to about 150 rotations per minute.

The chamber 100 further includes a process kit shield, or shield 174, to surround the processing, or first volume 113 of the chamber 100 and to protect other chamber components from damage and/or contamination from processing. In some embodiments, the shield 174 may be a grounded shield connected to a ledge 176 of an adapter 142

The shield 174 extends downward and may include one or more sidewalls 180 configured to surround the first volume 113. The shield 174 extends downward along the walls of the adapter 142 and the chamber wall 108 to below an upper surface of the substrate support 102, radially inward, and then returns upward to form an upwardly extending lip 188, for example, reaching an upper surface of the substrate support 102 (e.g., forming a u-shaped portion 184 at the bottom). Alternatively, the bottommost portion of the shield 174 need not be a u-shaped portion 184 and may have any suitable shape. A first ring 148 (i.e., a cover ring) rests on the top of the upwardly extending lip 188 of the shield 174 when the substrate support 102 is in a lower, loading position (as shown in FIG. 3C). When the substrate support 102 is in an upper position (as illustrated in FIG. 1 and FIG. 3A), the first ring 148 rests on the top of the upwardly extending lip 188 of the shield 174 and the outer periphery of the substrate support 102.

An additional second ring 111 (i.e., a deposition ring) may be used to protect the substrate support 102 from sputter deposition. For example, the second ring 111 may be disposed about a peripheral edge of the substrate support 102 and adjacent to the substrate processing surface 109 as illustrated in FIG. 1. In some embodiments, the second ring 111 may shield exposed surfaces of the substrate support 102 as shown.

in some embodiments, a magnet 190 may be disposed about the chamber 100 for selectively providing a magnetic field between the substrate support 102 and the target 106. For example, the magnet 190 may be disposed about the outside of the chamber wall 108 in a region just above the substrate support 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

A controller 110 may be provided and coupled to various components of the chamber 100 to control the operation of the chamber 100. The controller 110 includes a central processing unit (CPU) 112, a memory 114, and support circuits 116. The controller 110 may control the chamber 100 directly, or via computers (or controllers) associated with particular process chamber and/or support system components. The controller 110 may be one of any form of general-purpose computer processor that can be used in an industrial setting for controlling various chambers and subprocessors. The memory, or computer readable medium, 114 of the controller 110 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 116 are coupled to the CPU 112 for supporting the processor in a conventional manner. Support circuits 116 typically include cache, power supplies, clock circuits, input/output circuitry and subsystems, and the like. Inventive methods as described herein, specifically for example the method 200 described above, may be stored in the memory 114 as software routine that may be executed or invoked to control the operation of the chamber 100 in the manner described herein. The software routine may also be stored and/or executed by a second CPU (not shown) that is remotely located from the hardware being controlled by the CPU 112.

While the foregoing is directed to particular embodiments of the present disclosure, other and further embodiments of the disclosure may be devised without departing from the basic scope of the disclosure.

The invention claimed is:

1. A method of processing a substrate, comprising:
   (a) sputtering target material from a metal target for a first amount of time using a first plasma formed from an inert gas and a first amount of power applied to the metal target;
   (b) determining a first counter, wherein the first counter is a product of a flow rate of the inert gas provided to sputter target material from the metal target, the first amount of power applied to ignite the first plasma to sputter the target material from the metal target, and the first amount of time for which the metal target is sputtered;
   (c) sputtering a metal compound material from the metal target for a second amount of time using a second plasma formed from a process gas comprising a reactive gas and an inert gas and a second amount of power applied to the metal target;
   (d) determining a second counter, wherein the second counter is a product of a flow rate of the process gas provided to sputter the metal compound material from the metal target, the second amount of power applied to ignite the second plasma to sputter the metal compound material from the metal target, and the second amount of time for which the metal compound material is sputtered;
   (e) determining a third counter, wherein the third counter is the first counter minus the second counter; and
   (f) depositing a metal compound layer onto a predetermined number of substrates, wherein a deposition time for each substrate is adjusted based on the third counter to deposit the metal compound layer.

2. The method of claim 1, further comprising:
(g) repeating (a)-(f) to deposit the metal compound layer onto a predetermined number of substrates after resetting the first counter and second counter.

3. The method of claim 1, wherein (f) further comprises maintaining one or more of a thickness, a sheet resistivity (Rs), or a resistivity of the metal compound layer within a predetermined tolerance across multiple substrate runs.

4. The method of claim 1, wherein the flow rate of the inert gas is about 5 to about 1000 sccm.

5. The method of claim 1, wherein the inert gas is at least one of argon, xenon, or krypton.

6. The method of claim 1, wherein the metal target is titanium or aluminum.

7. The method of claim 1, wherein the reactive gas is a nitrogen-containing gas or an oxygen-containing gas and the inert gas is at least one of argon, xenon, or krypton.

8. The method of claim 1, wherein the metal compound layer is titanium nitride, or aluminum nitride, or aluminum oxide.

9. The method of claim 1, wherein the first amount of power and the second amount of power is RF power of about 50 to about 10,000 watts.

10. The method of claim 1, wherein the first amount of time and the second amount of time is about 1 to about 100 seconds.

11. A method of processing a substrate, comprising:
(a) sputtering titanium material from a titanium target for a first amount of time using a first plasma formed from an inert gas and a first amount of power applied to the titanium target;
(b) determining a first counter, wherein the first counter is a product of a flow rate of the inert gas provided to sputter titanium material from the titanium target, the first amount of power applied to ignite the first plasma to sputter the titanium material from the titanium target, and the first amount of time for which the titanium target is sputtered;
(c) sputtering titanium nitride from the titanium target for a second amount of time using a second plasma formed from a process gas comprising an inert gas and a nitrogen-containing gas and a second amount of power applied to the titanium target;
(d) determining a second counter, wherein the second counter is a product of a flow rate of the process gas provided to sputter titanium nitride from the titanium target, the second amount of power applied to ignite the second plasma to sputter titanium nitride from the titanium target, and the second amount of time for which the titanium nitride is sputtered;
(e) determining a third counter, wherein the third counter is the first counter minus the second counter; and
(f) depositing a titanium nitride layer onto a predetermined number of substrates, wherein a deposition time for each substrate is adjusted based on the third counter to deposit the titanium nitride layer.

12. The method of claim 11, further comprising:
(g) repeating (a)-(f) to deposit the titanium nitride layer onto a predetermined number of substrates after resetting the first counter and second counter.

13. The method of claim 11, wherein (f) further comprises maintaining one or more of a thickness, a sheet resistivity (Rs), or a resistivity of the titanium nitride layer within a predetermined tolerance across multiple substrate runs.

14. The method of claim 11, wherein the flow rate of the inert gas is about 5 to about 1000 sccm.

15. The method of claim 11, wherein the inert gas is at least one of argon, xenon, or krypton.

16. The method of claim 11, wherein the first amount of power and the second amount of power is RF power of about 50 to about 10,000 watts.

17. The method of claim 11, wherein the first amount of time and the second amount of time is about 1 to about 100 seconds.

18. A non-transitory computer readable medium having instructions stored thereon that, when executed, cause a method for processing a substrate, the method comprising:
(a) sputtering titanium material from a titanium target for a first amount of time using a first plasma formed from an inert gas and a first amount of power applied to the titanium target;
(b) determining a first counter, wherein the first counter is a product of a flow rate of the inert gas provided to sputter titanium material from the titanium target, the first amount of power applied to ignite the first plasma to sputter the titanium material from the titanium target, and the first amount of time for which the titanium target is sputtered;
(c) sputtering titanium nitride from the titanium target for a second amount of time using a second plasma formed from a process gas comprising an inert gas and a nitrogen-containing gas and a second amount of power applied to the titanium target;
(d) determining a second counter, wherein the second counter is a product of a flow rate of the process gas provided to sputter titanium nitride from the titanium target, the second amount of power applied to ignite the second plasma to sputter titanium nitride from the titanium target, and the second amount of time for which the titanium nitride is sputtered;
(e) determining a third counter, wherein the third counter is the first counter minus the second counter; and
(f) depositing a titanium nitride layer onto a predetermined number of substrates, wherein a deposition time for each substrate is adjusted based on the third counter to deposit the titanium nitride layer.

19. The computer readable medium of claim 16, further comprising:
(g) repeating (a)-(f) to deposit the titanium nitride layer onto a predetermined number of substrates after resetting the first counter and second counter.

20. The computer readable medium of claim 18, wherein (f) further comprises maintaining one or more of a thickness, a sheet resistivity (Rs), or a resistivity of the titanium nitride layer within a predetermined tolerance across multiple substrate runs.

* * * * *